(12) United States Patent
Perotti et al.

(10) Patent No.: US 11,863,491 B2
(45) Date of Patent: Jan. 2, 2024

(54) TRANSMITTER DEVICE AND RECEIVER DEVICE FOR EFFICIENT TRANSMISSION OF INFORMATION MESSAGES

(71) Applicant: Huawei Technologies Co., Ltd., Shenzhen (CN)

(72) Inventors: Alberto Giuseppe Perotti, Segrate (IT); Branislav M. Popovic, Kista (SE)

(73) Assignee: Huawei Technologies Co., Ltd., Shenzhen (CN)

( * ) Notice: Subject to any disclaimer, the term of this patent is extended or adjusted under 35 U.S.C. 154(b) by 520 days.

(21) Appl. No.: 17/152,457

(22) Filed: Jan. 19, 2021

(65) Prior Publication Data

US 2021/0143965 A1 May 13, 2021

Related U.S. Application Data

(63) Continuation of application No. PCT/EP2018/071441, filed on Aug. 8, 2018.

(51) Int. Cl.
*H04L 5/00* (2006.01)
*H04L 1/00* (2006.01)
(Continued)

(52) U.S. Cl.
CPC .......... *H04L 5/0053* (2013.01); *H04L 1/0057* (2013.01); *H04L 1/0071* (2013.01)

(58) Field of Classification Search
CPC ... H04J 13/0003; H04J 11/004; H04L 1/0041; H04L 1/0057; H04L 1/0071; H04L 5/0051; H04L 5/0053
See application file for complete search history.

(56) References Cited

FOREIGN PATENT DOCUMENTS

| CN | 102740325 A | 10/2012 |
|---|---|---|
| CN | 106464645 A | 2/2017 |

(Continued)

OTHER PUBLICATIONS

R. Zhang and L. Hanzo, "A Unified Treatment of Superposition Coding Aided Communications: Theory and Practice," in IEEE Communications Surveys & Tutorials, vol. 13, No. 3, pp. 503-520, Third Quarter 2011, doi: 10.1109/SURV.2011.061610.00102. (Year: 2011).*

(Continued)

*Primary Examiner* — Gary Mui
(74) *Attorney, Agent, or Firm* — Leydig, Voit & Mayer, Ltd.

(57) ABSTRACT

The invention relates to a transmitter device and a receiver device for efficient transmission of information messages. The transmitter device superposes a selected subset of columns of a projection matrix based on an information message so as to obtain a signal for transmission. The signal is transmitted to the receiver device. The receiver device performs iterative successive interference cancellation on a received signal based on a projection matrix so as to obtain a subset of the columns of the projection matrix and therefrom obtains a recovered information message based on the subset of the columns of the projection matrix. Thereby, it is provided a sparse superposition coding scheme with quasi-orthogonal projection matrix achieving good performance in respect of spectral efficiency. Furthermore, the invention also relates to corresponding methods and a computer program.

17 Claims, 9 Drawing Sheets

(51) Int. Cl.
H04J 13/00 (2011.01)
H04J 11/00 (2006.01)

(56) References Cited

FOREIGN PATENT DOCUMENTS

WO 2018014272 A1 1/2018
WO 2018034585 A1 2/2018

OTHER PUBLICATIONS

Catt; "Remaining simulation assumptions for superposition coding"; Agenda Item:6.2.7.3 3GPP TSG RAN WG1 Meeting #81 Fukuoka, Japan, May 25-29, 2015 R1-152597 (Year: 2015).*
Nikopour et al.,"SCMA for Downlink Multiple Access of 5G Wireless Networks," Globecom 2014—Wireless Communications Symposium, pp. 3940-3945 (2014).
"3rd Generation Partnership Project; Technical Specification Group Radio Access Network; NR; Physical channels and modulation (Release 15)," 3GPP TS 38.211 V15.1.0, total 90 pages, 3rd Generation Partnership Project, Valbonne, France (Mar. 2018).
Barbier et al., "Approximate Message-Passing Decoder and Capacity Achieving Sparse Superposition Codes," IEEE Transactions on Information Theory, vol. 63, No. 8, pp. 4894-4927, Institute of Electrical and Electronics Engineers, New York, New York (Aug. 2017).
"3rd Generation Partnership Project; Technical Specification Group Radio Access Network; NR; Multiplexing and channel coding (Release 15)," 3GPP TS 38.212 V15.1.1, total 94 pages, 3rd Generation Partnership Project, Valbonne, France (Apr. 2018).
Barron et al., "Toward Fast Reliable Communication at Rates Near Capacity with Gaussian Noise," Proc. IEEE Intern. Symp. Inform. Theory, pp. 315-319, Austin, Texas, U.S.A (Jun. 13-18, 2010).
Ji et al., "Sparse Vector Coding for 5G Ultra-Reliable and Low Latency Communications," 2018 IEEE International Conference on Communications (ICC), Kansas City, total 6 pages (May 2018).
MacWilliams et al., "The Theory of Error-Correcting Codes," total 771 pages, North-Holland Publishing Company (1977).
Calderbank et al., "Construction of a Large Class of Deterministic Sensing Matrices That Satisfy a Statistical sometry Property," in IEEE Journal of Selected Topics in Signal Processing, vol. 4, No. 2, pp. 358-374, Institute of Electrical and Electronics Engineers, New York, New York (Apr. 2010).
Popovic, "Quasi-Orthogonal Supersets," 2011 IEEE Information Theory Workshop, pp. 155-159 (2011).
Bottomley et al., "Signature Sequence Selection in a CDMA System with Orthogonal Coding," in IEEE Transactions on Vehicular Technology, vol. 42, No. 1, pp. 62-68, Institute of Electrical and Electronics Engineers, New York, New York (Feb. 1993).

* cited by examiner

TRANSMITTER DEVICE AND RECEIVER DEVICE FOR EFFICIENT TRANSMISSION OF INFORMATION MESSAGES

CROSS-REFERENCE TO RELATED APPLICATIONS

This application is a continuation of International Application No. PCT/EP2018/071441, filed on Aug. 8, 2018, the disclosure of which is hereby incorporated by reference in its entirety.

TECHNICAL FIELD

The present disclosure relates to a transmitter device and a receiver device for efficient transmission of information messages in a communication system. Furthermore, the present disclosure also relates to corresponding methods and a computer program.

BACKGROUND

3GPP is finalizing the standardization of the first release of 5th generation radio access network also known as New Radio (NR). In a first phase, NR has been focused on enhancing radio access network (RAN) capacity for enhanced Mobile BroadBand (eMBB) service category. In a second ongoing phase, 3GPP is addressing the new Ultra-Reliable and Low-Latency Communication (URLLC) service category. The primary eMBB objective is to achieve high throughputs with relaxed latency/reliability constraints. URLLC targets critical applications which require higher levels of communication reliability and/or shorter latency. Based on the characteristics of specific URLLC applications (e.g. tactile internet, industrial automation/remote control, autonomous driving, to mention few), it is expected that URLLC data traffic will consist of shorter messages.

In 3GPP NR standardization, the conventional low density parity check (LDPC) and polar coding and modulation techniques already adopted for NR eMBB data and control channels are being considered for transmission of URLLC messages. 3GPP NR uses LDPC codes for eMBB data channels and polar codes for control channels. As URLLC imposes tighter bloc error rate (BLER) targets, the deployment of LDPC/polar codes for URLLC data transmission must use decreased code rates/modulation orders in order to obtain increased reliability over eMBB. Moreover, as typical URLLC traffic consists of messages shorter than eMBB, rates must be further decreased to compensate for diminished coding gains. As a result, LDPC/polar coded URLLC transmission achieves a smaller spectral efficiency compared to eMBB.

However, as those techniques have not been designed for URLLC/short message transmission, the required URLLC reliability is achieved, for any given signal to interference and noise ration (SINR), by reducing code rate and modulation order. The direct consequence is that the URLLC spectral efficiency is smaller than eMBB. It is therefore necessary to develop more efficient transmission schemes that potentially provide better performance than LDPC/polar codes and conventional modulations when used for reliable transmission of short messages.

SUMMARY

The present disclosure provides a solution which mitigates or solves drawbacks and problems of conventional solutions.

The present disclosure also provides a solution which provides higher spectral efficiency for transmission of information messages compared to conventional solutions.

According to a first aspect of the disclosure, a transmitter device for a communication system is provided, the transmitter device being configured to:

obtain an information message for transmission;

select a subset of columns of a projection matrix based on the information message, wherein the projection matrix is a concatenation of a plurality of submatrices, wherein each sub-matrix has M number of rows, and wherein two columns in the same sub-matrix are orthogonal, and wherein two columns belonging to different sub-matrices have a correlation that is equal to or less than $1/\sqrt{M}$; and superpose the selected subset of columns of the projection matrix so as to obtain a signal for transmission comprising M number of transmission symbols.

Concatenation of submatrices can in this disclosure be understood to mean column-wise concatenation. In a column-wise concatenation, a new matrix is created using all the columns of the submatrices where a $1^{st}$ (leftmost) group of consecutive columns of the new matrix are the columns of a $1^{st}$ submatrix taken in the same order as they appear in the $1^{st}$ submatrix, a $2^{nd}$ group of consecutive columns in the new matrix are the columns of a $2^{nd}$ submatrix taken in the same order as they appear in the $2^{nd}$ submatrix, and so on until all submatrices have been concatenated. The concatenation can be column-wise—also called "horizontal concatenation"—or row-wise—also called "vertical concatenation".

That two columns belonging to different sub-matrices have a correlation that is equal to or less than $1/\sqrt{M}$ can herein be understood as that the inner product of those two columns divided by their magnitudes is equal to or less than $1/\sqrt{M}$.

Superpose can in this disclosure mean that the superposed columns are summed.

An advantage of the transmitter device according to the first aspect is that it provides a sparse superposition coding scheme with quasi-orthogonal projection matrix thereby achieving good performance in respect of spectral efficiency.

In an implementation form of a transmitter device according to the first aspect, the transmitter device is further configured to transmit the signal for transmission to a receiver device.

In an implementation form of a transmitter device according to the first aspect, the transmitter device is further configured to:

select a sparse vector from a set of sparse vectors based on the information message; and multiply the selected sparse vector with the projection matrix.

An advantage with this implementation form is that superposition can be performed by conventional matrix-by-vector multiplication where the matrix is projection matrix and vector is a sparse vector.

In an implementation form of a transmitter device according to the first aspect, the transmitter device is further configured to interleave the selected sparse vector before multiplying the selected sparse vector with the projection matrix.

An advantage with this implementation form is that it allows rearrangement of the columns of the projection matrix in any convenient order for storage or online generation, regardless whether orthogonal columns are stored in adjacent positions.

In an implementation form of a transmitter device according to the first aspect, each column of each submatrix is a Kerdock bent sequence of length M.

An advantage with this implementation form is that the columns of the projection matrix have a correlation which is equal to or less than $1/\sqrt{M}$.

In an implementation form of a transmitter device according to the first aspect, each column of each submatrix is a Zadoff-Chu sequence of length M.

An advantage with this implementation form is that the columns of the projection matrix have a correlation which is equal to or less than $1/\sqrt{M}$.

In an implementation form of a transmitter device according to the first aspect, at least one submatrix of the projection matrix is a phase-rotated version of another submatrix of the projection matrix.

An advantage with this implementation form is that more submatrices can be obtained by phase rotation of a same submatrix, thus allowing generation of larger projection matrices that potentially provide higher spectral efficiency.

In an implementation form of a transmitter device according to the first aspect, the transmitter device is further configured to select one column from each submatrix.

An advantage with this implementation form is that it simplifies detection of each column in the received signal.

In an implementation form of a transmitter device according to the first aspect, the transmitter device is further configured to select two or more columns from each submatrix.

An advantage with this implementation form is that it transmits a large number of superposed columns thereby resulting in potentially higher spectral efficiency.

In an implementation form of a transmitter device according to the first aspect, the transmitter device is further configured to puncture symbols of the signal for transmission when a number of time-frequency resources available for transmission is smaller than the M number of transmission symbols of the signal for transmission.

An advantage with this implementation form is that the transmission signal can be easily adapted to less than M time-frequency resources available for transmission.

In an implementation form of a transmitter device according to the first aspect, the transmitter device is further configured to repeat symbols of the signal for transmission when a number of time-frequency resources available for transmission is larger than M number of transmission symbols of the signal for transmission.

An advantage with this implementation form is that the transmission signal can be conveniently adapted to more than M time-frequency resources available for transmission.

According to a second aspect of the disclosure, a receiver device for a communication system is provided, the receiver device being configured to:
receive a signal from a transmitter device, wherein the received signal comprises M number of symbols associated with an information message;
obtain a projection matrix, wherein the projection matrix is a concatenation of a plurality of submatrices, wherein each sub-matrix has M number of rows, and wherein two columns in the same sub-matrix are orthogonal, and wherein two columns belonging to different sub-matrices has a correlation that is equal to or less than $1/\sqrt{M}$;
perform iterative successive interference cancellation on the received signal (r) based on the projection matrix so as to obtain a (selected) subset of the columns of the projection matrix; and
obtain a recovered information message based on the (selected) subset of the columns of the projection matrix.

When the set of the columns of the projection matrix has been obtained the information message can be obtained by inverse mapping since the relation is one-to-one.

An advantage of the receiver device according to the second aspect is that a sparse superposition coding scheme with quasi-orthogonal projection matrix is used for transmission of the information message thereby achieving good performance in respect of spectral efficiency.

In an implementation form of a receiver device according to the second aspect, the receiver device is further configured to:
determine a set of submatrices comprising all the submatrices in the projection matrix;
determine an interference cancelation signal to be equal to the received signal;
 a) project the interference cancelation signal onto each column of the submatrices of the set of submatrices so as to obtain a set of projections,
 b) select a column of the projection matrix with the largest projection in the set of projections,
 c) add the selected column to a subset of the columns of the projection matrix,
 d) cancel the selected column from the interference cancelation signal so as to obtain an updated interference cancelation signal,
 e) remove the submatrix comprising the selected column from the set of submatrices; and
repeat a) to e) until the set of submatrices is empty and output the subset of the columns of the projection matrix in c).

According to a third aspect of the disclosure, a method is provided for a transmitter device, the method comprising:
obtaining an information message for transmission;
selecting a subset of columns of a projection matrix based on the information message, wherein the projection matrix is a concatenation of a plurality of submatrices, wherein each sub-matrix has M number of rows, and wherein two columns in the same sub-matrix are orthogonal, and wherein two columns belonging to different sub-matrices have a correlation that is equal to or less than $1/\sqrt{M}$; and
superposing the selected subset of columns of the projection matrix so as to obtain a signal for transmission comprising M number of transmission symbols.

The method according to the third aspect can be extended into implementation forms corresponding to the implementation forms of the transmitter device according to the first aspect. Hence, an implementation form of the method comprises the feature(s) of the corresponding implementation form of the transmitter device.

The advantages of the methods according to the third aspect are the same as those for the corresponding implementation forms of the transmitter device according to the first aspect.

According to a fourth aspect of the disclosure, a method is provided for a receiver device, the method comprising:
receiving a signal from a transmitter device, wherein the received signal comprises M number of symbols associated with an information message;
obtaining a projection matrix, wherein the projection matrix is a concatenation of a plurality of submatrices, wherein each sub-matrix has M number of rows, and wherein two columns in the same sub-matrix are orthogonal, and wherein two columns belonging to different sub-matrices has a correlation that is equal to or less than $1/\sqrt{M}$;

performing iterative successive interference cancellation on the received signal based on the projection matrix so as to obtain a (selected) subset of the columns of the projection matrix; and obtaining a recovered information message based on the (selected) subset of the columns of the projection matrix.

The method according to the fourth aspect can be extended into implementation forms corresponding to the implementation forms of the receiver device according to the second aspect. Hence, an implementation form of the method comprises the feature(s) of the corresponding implementation form of the receiver device.

The advantages of the methods according to the fourth aspect are the same as those for the corresponding implementation forms of the receiver device according to the second aspect.

The present disclosure also relates to a computer program, characterized in program code, which, when run by at least one processor, causes said at least one processor to execute any method according to embodiments of the disclosure. Further, the present disclosure also relates to a computer program product comprising a computer readable medium and said mentioned computer program, wherein said computer program is included in the computer readable medium, and comprises of one or more from the group: ROM (Read-Only Memory), PROM (Programmable ROM), EPROM (Erasable PROM), Flash memory, EEPROM (Electrically EPROM) and hard disk drive.

Further applications and advantages of the embodiments of the disclosure will be apparent from the following detailed description.

BRIEF DESCRIPTION OF THE DRAWINGS

The appended drawings are intended to clarify and explain different embodiments, in which.

DETAILED DESCRIPTION

Sparse Superposition Coding (SSC) and Sparse Vector Coding (SVC) are families of transmission schemes that potentially provide increased efficiency for any information message length. The core of any SSC/SVC transmission schemes is a codebook, i.e., a collection of codewords of a same length M. The SSC/SVC transmitter selects a small subset of codewords from the codebook, where selection is based on the information message. The transmitter then generates the signal for transmission by superposition of the selected codewords.

To conveniently represent the SSC/SVC encoding procedure, the codebook is arranged in a SSC projection matrix F where each column of the projection matrix F is a codeword. In the SSC/SVC encoder, a K-bit information message m is first mapped to a set of sparse vectors X obtaining a sparse vector x, then the sparse vector is used to select a subset of the columns of the SSC projection matrix and superpose them in the transmitted signal z as follows:

$$z = Fx \qquad (1)$$

where F has size M×N, with M<N. In other words equation (1) formulates the multiplication of the selected sparse vector (x) with the projection matrix (F).

SSC and SVC differ in the sparse vector set X. SSC has a sparse vector set obtained by Pulse-Position Modulation (PPM), i.e., message m is divided into L segments of size b bits each. Each segment is mapped to one of L subvectors $x_1, \ldots, x_L$ of same length B, where the $l^{th}$ subvector has h=1 non-zero elements. The locations of the non-zero elements are obtained based on the bits in the $l^{th}$ message segment. For SVC, the $l^{th}$ subvector has h>1 non-zero elements whose locations are obtained based on the message bits in the $l^{th}$ message segment. A sparse vector x of length N=LB containing hL<<N non-zero elements is obtained by concatenation of the L sub-vectors $x_1, \ldots, x_L$. L is the density level of the corresponding SSC/SVC scheme. This method is in other words to select a sparse vector x from a set of sparse vectors X based on the information message m.

In order to keep the description more simple, it is assumed that the columns of projection matrix F have constant magnitude, i.e. $f_i^* f_i = M$ for any i=1, ..., N. However, using projection matrices with non-constant column magnitude is not precluded.

Embodiments of the disclosure include devices and corresponding methods for reliable and efficient transmission of information messages in a communication system. The signal for transmission is obtained by superposition of selected columns from a quasi-orthogonal SSC projection matrix F where the columns are selected based on the information message. The QO-SSC projection matrix is in embodiments designed according to a construction based either on sequences obtained from Kerdock codes or based on Zadoff-Chu sequence sets. The QO-SSC matrix design simplifies encoding/decoding and, at the same time, provide higher spectral efficiency compared to conventional solutions.

Figure 1:
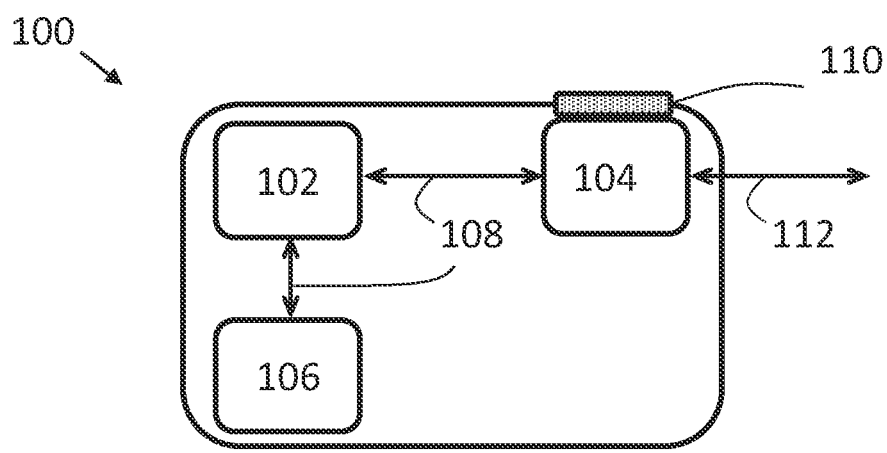
FIG. 1 shows a transmitter device according to an embodiment.

Therefore, FIG. 1 shows a transmitter device 100 according to an embodiment. In the embodiment shown in FIG. 1, the transmitter device 100 comprises a processor 102, a transmitter 104 and a memory 106. The processor 102 is coupled to the transmitter 104 and the memory 106 by communication means 108 known in the art. The transmitter device 100 may be configured for both wireless and wired communications in wireless and wired communication systems, respectively. The wireless communication capability is provided with an antenna or antenna array 110 coupled to the transmitter 104, while the wired communication capability is provided with a wired communication interface 112 coupled to the transmitter 104. That the transmitter device 100 is configured to perform certain actions can in this disclosure be understood to mean that the transmitter device 100 comprises suitable means, such as e.g. the processor 102 and the transmitter 104, configured to perform said actions.

According to embodiments, the transmitter device 100 is configured to obtain an information message m for transmission. The transmitter device 100 is further configured to select a subset of columns of a projection matrix F based on the information message m, wherein the projection matrix F is a concatenation of a plurality of submatrices $F=[F_1 F_2 \ldots F_C]$, wherein each sub-matrix $F_c$ has M number of rows, and wherein two columns in the same sub-matrix are orthogonal, and wherein two columns belonging to different sub-matrices $[F_1 F_2 \ldots F_C]$ have a correlation that is equal to or less than $1/\sqrt{M}$. The transmitter device 100 is further configured to superpose the selected subset of columns of the projection matrix F so as to obtain a signal for transmission z comprising M number of transmission symbols.

Figure 2:
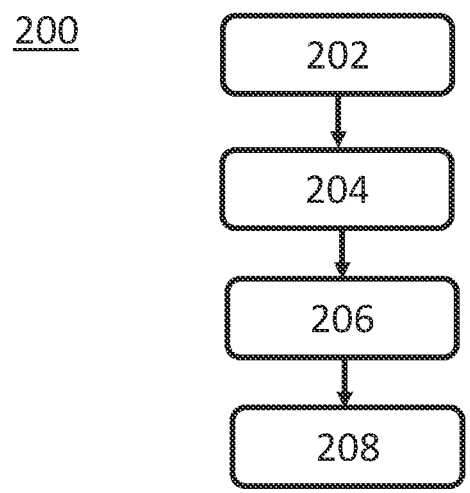
FIG. 2 shows a method for a transmitter device according to an embodiment.

FIG. 2 shows a flow chart of a corresponding method 200 which may be executed in a transmitter device 100, such as the one shown in FIG. 1. The method 200 comprises obtaining 202 an information message m for transmission. The method 200 further comprises selecting 204 a subset of columns of a projection matrix F based on the information message m, wherein the projection matrix F is a concatenation of a plurality of submatrices $F=[F_1 F_2 \ldots F_C]$, wherein each sub-matrix $F_c$ has M number of rows, and wherein two columns in the same sub-matrix are orthogonal, and wherein two columns belonging to different sub-matrices $[F_1 F_2 \ldots F_C]$ have a correlation that is equal to or less than $1/\sqrt{M}$. The method 200 further comprises superposing 206 the selected subset of columns of the projection matrix F so as to obtain a signal for transmission z comprising M number of transmission symbols.

Figure 3:
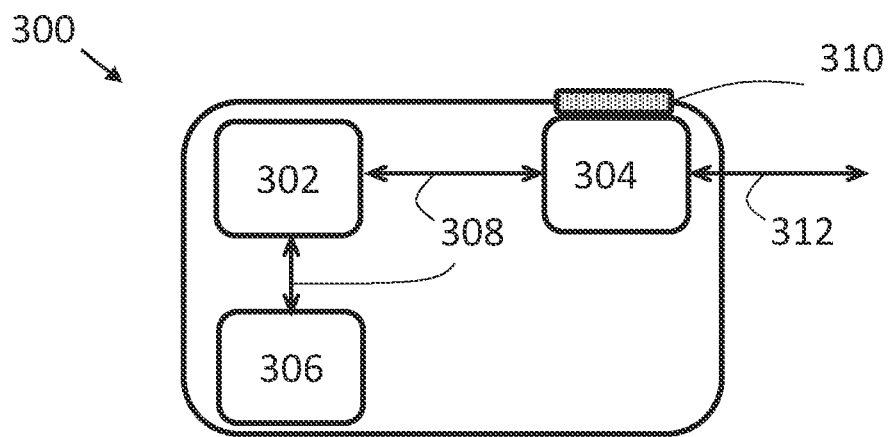
FIG. 3 shows a receiving device according to an embodiment.

FIG. 3 shows a receiver device 300 according to an embodiment. In the embodiment shown in FIG. 3, the receiver device 300 comprises a processor 302, a receiver 304 and a memory 306. The processor 302 is coupled to the receiver 304 and the memory 306 by communication means 308 known in the art. The receiver device 300 further comprises an antenna or antenna array 310 coupled to the receiver 304, which means that the receiver device 300 is configured for wireless communications in a wireless communication system. That the receiver device 300 is configured to perform certain actions can in this disclosure be understood to mean that the receiver device 300 comprises suitable means, such as e.g. the processor 302 and the receiver 304, configured to perform said actions.

According to embodiments, the receiver device 300 is configured to receive a signal r=z+n from a transmitter device 100, wherein the received signal r comprises M number of symbols associated with an information message m. Hence, the received signal comprises the signal z transmitted from the transmitter device 100 plus noise and/or interference denoted n. The receiver device 300 is further configured to obtain a projection matrix F, wherein the projection matrix F is a concatenation of a plurality of submatrices, i.e. $F=[F_1 F_2 \ldots F_C]$, wherein each sub-matrix $F_c$ has M number of rows, and wherein two columns in the same sub-matrix are orthogonal, and wherein two columns belonging to different sub-matrices has a correlation that is equal to or less than $1/\sqrt{M}$. The receiver device 300 is further configured to perform iterative successive interference cancellation on the received signal r based on the projection matrix F so as to obtain a (selected) subset of the columns of the projection matrix F. The receiver device 300 is further configured to obtain a recovered information message $\hat{m}$ based on the (selected) subset of the columns of the projection matrix F.

Figure 4:
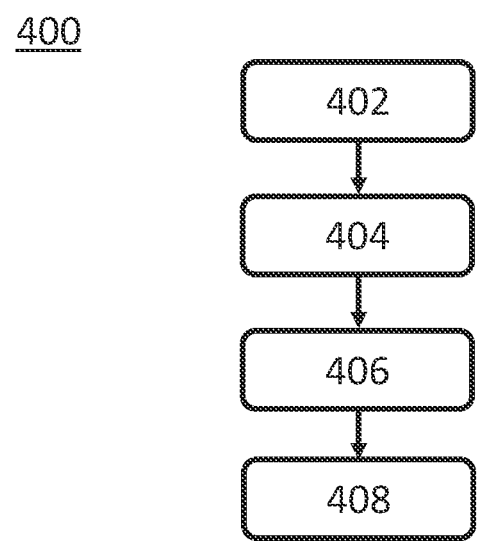
FIG. 4 shows a method for a receiving device according to an embodiment.

FIG. 4 shows a flow chart of a corresponding method 400 which may be executed in a receiver device 300, such as the one shown in FIG. 3. The method 400 comprises receiving 402 a signal r=z+n from a transmitter device 100, wherein the received signal r comprises M number of symbols associated with an information message m. The method 400 further comprises obtaining 404 a projection matrix F, wherein the projection matrix F is a concatenation of a plurality of submatrices $F=[F_1 F_2 \ldots F_C]$, wherein each sub-matrix $F_c$ has M number of rows, and wherein two columns in the same sub-matrix are orthogonal, and wherein two columns belonging to different sub-matrices has a correlation that is equal to or less than $1/\sqrt{M}$. The method 400 further comprises performing 406 iterative successive interference cancellation on the received signal r based on the projection matrix F so as to obtain a (selected) subset of the columns of the projection matrix F. The method 400 further comprises obtaining 408 a recovered information message $\hat{m}$ based on the (selected) subset of the columns of the projection matrix F.

Figure 5:
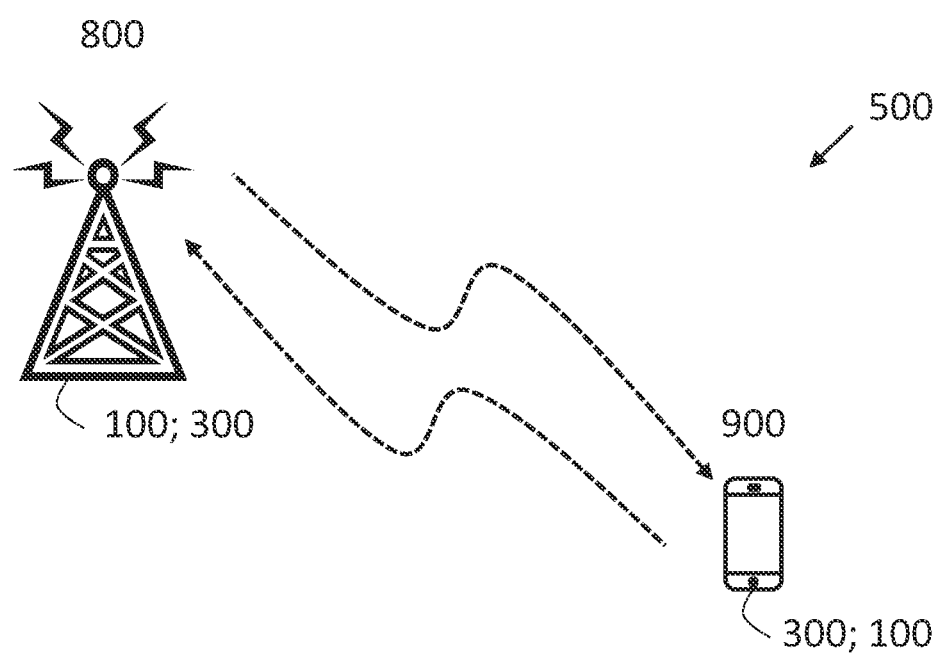
FIG. 5 shows a communication system according to an embodiment.

FIG. 5 shows a communication system 500 according to an embodiment. In the communication system 500 a network access node 800 interworks with a client device 900. It is illustrated in FIG. 5 that the network access node 800 can comprise a transmitter device 100 and a receiver device 300 according to embodiments. Likewise, the client device 300 can also comprise a transmitter device 100 and a receiver device 300 according to embodiments. The transmitter device 100 and/or the receiver device 300 can be part of another communication device such as mentioned network access node 800 and client device 900. However, the transmitter device 100 and/or the receiver device 300 can also be standalone devices cooperating with another communication device.

It is further to be noted from FIG. 5 that the communication system 500 in FIG. 5 is illustrated as a wireless communication system but embodiments of the invention are not limited thereto. The communication system 500 may be a wireless communication system a wired communication system or a combined wired and wireless communication system. The communication system 500 can e.g. be long term evolution (LTE), LTE Advanced, and a 3GPP NR system also denoted 5G.

Figure 6:
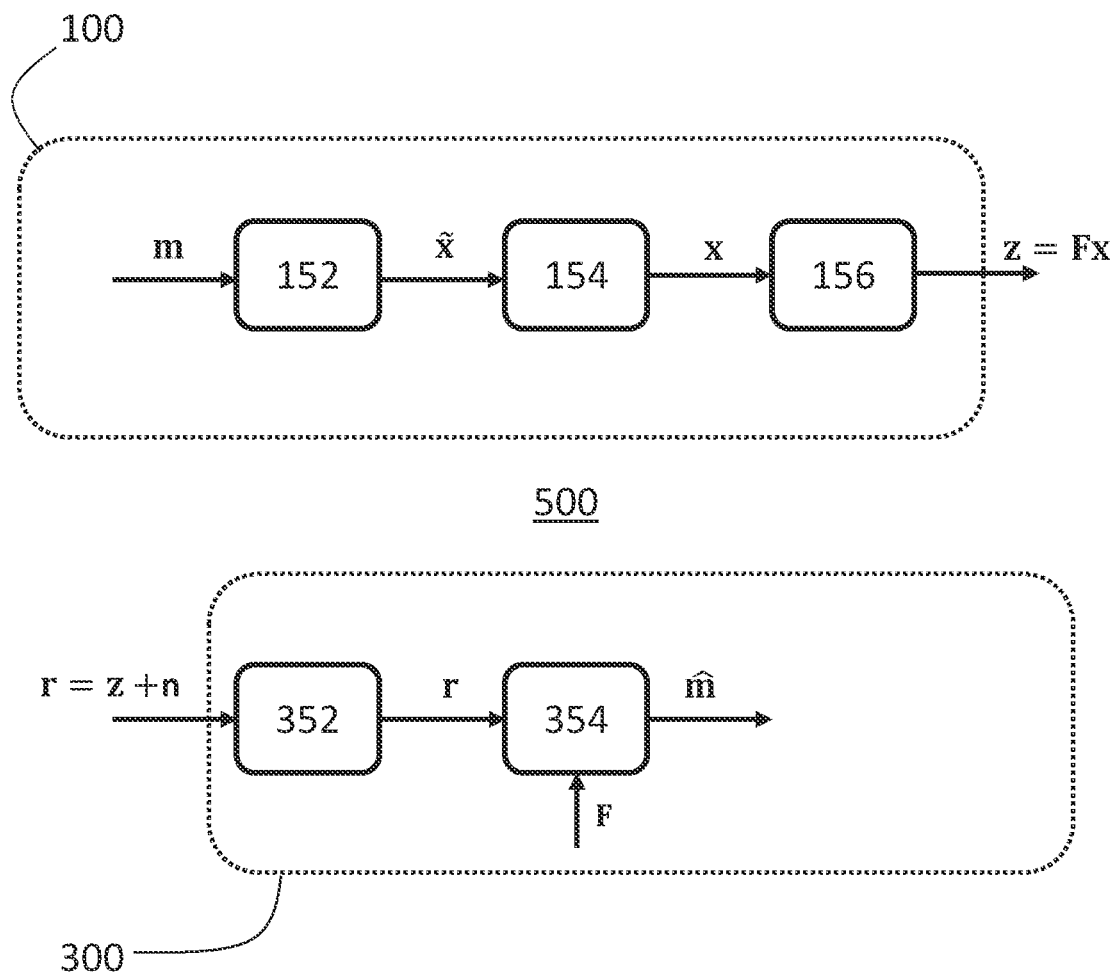
FIG. 6 shows a transmitter device interacting with a receiver device in a communication system according to an embodiment.

FIG. 6 shows a block diagram of a transmitter device 100 and a block diagram of a receiver device 300 in a communication system 500 according to an embodiment.

At the transmitter device 100 an information message m for transmission is forwarded to a mapping block 152. At the mapping block 152 the information message m is mapped to a sparse vector set X which results in a sparse vector x that is outputted to an interleaver block 154. The sparse vector x is interleaved in the interleaver block 154 and thereafter forwarded to a superposing block 156. The interleaver block 154 in FIG. 6 is optional and is considered transparent herein, i.e. x=x̃, for the rest of this disclosure without limiting the scope of the invention. Hence, interleaver block 154 is configured to interleave the selected sparse vector x before multiplying the selected sparse vector x with the projection matrix F. It is also noted that the mapping in the mapping block 152 can be performed according any method known in the art. At the superposing block 156 the interleaved sparse vector x is multiplied with a QO-SSC projection matrix according to a conventional mathematical matrix-vector product operation, where the $i^{th}$ column of the projection matrix is multiplied by the $i^{th}$ element of sparse vector so as to obtain a $i^{th}$ multiplied column, then all the multiplied columns are summed to obtain a superposed signal for transmission z. Finally, the transmitter device 100 transmits the signal for transmission z to a receiver device 300 in the communication system 500. In any SSC/SVC scheme, the complex symbols produced by the encoder can be mapped to time-frequency-space resource elements in the same way as the symbols of a conventional modulation. Thus, in SSC/SVC the modulation is considered to be joint and included in the encoding.

At the receiver device 300, a signal is received transmitted from the transmitter device 100. The signal r is received in a reception block 352 and thereafter forwarded to an iterative successive interference cancellation (ISIC) block 355. The ISIC block 355 has also obtained the projection matrix F. In one example the projection matrix F has been obtained through control signaling. For example, in case the receiver device 300 is part of a client device 900 the projection matrix F can be dynamically signaled in a downlink control channel, such as the physical downlink/uplink control channel (PDCCH/PUCCH). In another non-limiting example the projection matrix F can be obtained from a library of predefined projection matrices which is known to both transmitter device(s) 100 and receiver device(s) 300 in the communication system 500. The index of the matrix used by the transmitter device 100 is dynamically signaled to the receiver device 300 in a downlink control channel, such as the physical downlink/uplink control channel (PDCCH/PUCCH). In a further non-limiting example, the projection matrix F can semi-statically configured in the transmitter device 100 and receiver device by higher-layer signaling, such as radio resource control (RRC) signaling.

The ISIC block 355 performs iterative successive interference cancellation on the received signal r based on the obtained projection matrix F so as to obtain a subset of the columns of the projection matrix F. The iterations continues until a set S of submatrices is empty. Therefore, in an embodiment, the receiver device 300 is configured to initiate the algorithm by determining a set S of submatrices comprising all the submatrices in the projection matrix F. To start the decoding algorithm it is determined at the initiation that an interference cancelation signal $r_c$ is equal to the received signal r. Thereafter, the iterations proceed by performing the flowing steps:

a) project the interference cancelation signal $r_c$ onto each column of the submatrices of the set S of submatrices so as to obtain a set of projections,
b) select a column of the projection matrix F with the largest projection in the set of projections,
c) add the selected column to a subset of the columns of the projection matrix F,
d) cancel or subtract the selected column from the interference cancelation signal $r_c$ so as to obtain an updated interference cancelation signal $r_c$,
e) remove the submatrix comprising the selected column from the set S of submatrices.

These steps a) to e) are repeated in the algorithm until the set S of submatrices is empty and output the subset of the columns of the projection matrix F in c).

Generally, the design of the projection matrix F is crucial for providing good SSC transmission efficiency. The QO projection matrix design herein disclosed can be based on the following procedure:

1. Take a set of mutually-orthogonal sequences and place them in the leftmost columns of projection matrix F;
2. Iteratively add new sequence sets into the rightmost columns of projection matrix F, where the sequences in each new set are orthogonal. Moreover, the sequences in each new set are quasi-orthogonal to the sequences already in projection matrix F.

To reflect the above design procedure, the SSC projection matrix F is conveniently represented as the column-wise/horizontal concatenation of C submatrices as $$F=[F_1 F_2 \ldots F_C]. \quad (2)$$

where each submatrix $F_c$, c=1, ..., C corresponds to one set of orthogonal sequences which means that the correlation between any two different sequences is zero. Each submatrix has size M×D and the columns in each submatrix are orthogonal, i.e., $f_i^H f_j = 0$ for any i,j∈{1, ..., D}, i≠j. Two columns $f_p$, $f_q$ that belong to different sub-matrices are quasi-orthogonal, i.e. their correlation, defined as:

$$\frac{|f_p^H f_q|}{|f_p| \, |f_q|}, p \neq q \quad (3)$$

is much smaller than 1.

In the context of compressed sensing, matrices with similar properties are being used for other purposes. A key property of any good compressed sensing matrix M is its coherence ρ, conventionally defined as the maximum inner product magnitude between any two of its columns:

$$\rho(M) = \max_{\substack{i,j=1,\ldots,N \\ i \neq j}} |\langle m_i, m_j \rangle| \quad (4a)$$

where $m_i$, $m_j$ are two columns of M. A slightly different definition of coherence will be of interest later on when treating coherent SSC signal reception, i.e. at the receiver device 300:

$$\rho_\mathcal{R}(M) = \max_{\substack{i,j=1,\ldots,N \\ i \neq j}} \mathcal{R}\langle m_i, m_j \rangle. \quad (4b)$$

where $\mathcal{R}(\cdot)$ denotes the real part of a complex number.

Good SSC projection matrices, including the QO SSC matrices, have low coherence, thus they are potentially good compressed sensing measurement matrices.

With low coherence, the superposed columns in the received signal r, where r=z+n is the transmitted signal z corrupted by e.g., noise/interference/distortion n, can be easily detected by projecting the received signal r onto each column of the projection matrix F. For example, the projections might be computed as $$p_i=|\langle f_i, r \rangle|, i=1, \ldots, N. \quad (5)$$

The set $\mathfrak{I}^*$ of the indices that correspond to the L largest projections, formally defined as $$\mathfrak{I}^* = \arg\max_{\substack{\mathfrak{I} \subseteq \{1,\ldots,N\} \\ |\mathfrak{I}|=L}} \sum_{i \in \mathfrak{I}} p_i \quad (6)$$

is used to recover the transmitted information message m. In equation (6), $\mathfrak{I}$ is any L-element subset of {1, ..., N}. The basic SSC receiver in equation (6) highlights the principle of operation of any SSC/SVC decoder. If the coherence ρ(F) is high, then received signal projection onto each column incurs high interference from other superposed columns, thereby making information message recovery error-prone.

It is therefore understood that, given any SSC projection matrix F with coherence (4a) or (4b):
1. Any matrix F' obtained by permuting the columns/rows of the projection matrix F in an arbitrary order has the same coherence as the projection matrix F. Thus, F' is as good as the projection matrix F when used as a SSC projection matrix;
2. Any matrix F" obtained by removing any arbitrary subset of the columns of the projection matrix F has the same or lower coherence than the projection matrix F. Thus, F" is as good as or better than the projection matrix F when used as a SSC projection matrix.
3. Any matrix F'" obtained by arbitrary constant phase rotation of the projection matrix F as F'"=$e^{j\theta}$F has the same coherence as the projection matrix F. Thus, F'" is as good as the projection matrix F when used as a SSC projection matrix.

In an embodiment, the columns of the projection matrix F are obtained from the set of Kerdock bent sequences of length M=$2^m$, m even and then used for transmission according to a SSC scheme. Kerdock bent sequences of length M are obtained from the coset leaders of a Kerdock code of same length M. A Kerdock code is the union of $2^{m-1}$ cosets of a first-order Reed-Muller code RM(1, m) whose codeword length is $2^m$. The codewords in each coset are obtained by bit-wise modulo-2 sum of each of the codewords of RM (1, m) and a coset leader. The coset leader is therefore a representative codeword of the corresponding coset.

Given the set $\{\lambda_1, \ldots, \Delta_{2^{m-1}}\}$ of Kerdock coset leaders, a set of modulated coset leaders $\{\mu_1, \ldots, \mu_{2^{m-1}}\}$ is obtained, e.g., by BPSK modulation as $\mu_k=1-2\lambda_k$, k=1 ..., $2^{m-1}$. The $c^{th}$ submatrix $F_c$ is obtained as $$[F_c]_{i,j}=[H_M]_{i,j}[\lambda_c]_i, c=1, \ldots, 2^{m-1}, i,j=1, \ldots, M \quad (7a)$$

or equivalently $$F_c=H_M \circ \Lambda_c, c=1, \ldots, 2^{m-1} \quad (7b)$$

where $\circ$ indicates the Hadamard (element-wise) product, $H_M$ is the Hadamard matrix of size M×M and $\Lambda_c$ is a M×M matrix with all its columns equal to $\lambda_c$.

It has been shown that the inner product between any two Kerdock bent sequences is upper bounded by $\sqrt{M}$. It follows that any Kerdock-based quasi-orthogonal (QO-K) SSC projection matrix fulfills (3) as $$\frac{|f_p^H f_q|}{|f_p||f_q|} \leq \frac{1}{\sqrt{M}}.$$

Thus, the corresponding QO-K SSC matrix has low coherence. Kerdock bent sequences have length M=$2^m$ (m any even positive integer). As an example, the coset leaders of the length-16 Kerdock code are shown in Table 1. Further, Table 2 below contains the coset leaders of the length-64 Kerdock code.

TABLE 1

Coset leaders of the length-16 Kerdock code.

| Coset leader | Value |
| --- | --- |
| $\lambda_1$ | 0 0 0 0 0 0 0 0 0 0 0 0 0 0 0 0 |
| $\lambda_2$ | 0 0 1 1 1 0 0 1 0 1 0 1 1 1 1 1 |
| $\lambda_3$ | 0 0 0 1 1 1 1 0 0 1 1 1 0 1 1 1 |
| $\lambda_4$ | 0 1 0 1 0 0 1 1 0 1 1 0 1 1 1 1 |
| $\lambda_5$ | 0 0 1 0 0 1 1 1 0 1 1 1 1 1 0 1 |
| $\lambda_6$ | 0 1 0 0 1 1 0 1 0 1 1 1 1 1 1 0 |
| $\lambda_7$ | 0 1 1 1 0 1 0 0 0 1 1 1 1 0 1 1 |
| $\lambda_8$ | 0 1 1 0 1 0 1 0 0 0 1 1 1 1 1 1 |

TABLE 2

Coset leaders of the length-64 Kerdock code.

| Coset leader | Value |
| --- | --- |
| $\lambda_1$ | 0000000000000000000000000000000000000000000000000000000000000000 |
| $\lambda_2$ | 0101000001011111101011110101111011000110110110001100011100010011 |
| $\lambda_3$ | 0110011001010100110011111111101101001010101010001110011110000 |
| $\lambda_4$ | 0111100001110000111011011011101111000100001110111011110001000 |
| $\lambda_5$ | 0111101111010001011110111010001011110111101000110001000010101110 |
| $\lambda_6$ | 0111101111011110101101110001001000101110100001011110001001000111 |
| $\lambda_7$ | 0111110110110111011001011101000001011011110100001000000111011011 |
| $\lambda_8$ | 0111111011101000110011100011100010010010011001010111101111010100 |
| $\lambda_9$ | 0110111111110011010110011000101010111000011010100111100001001 |
| $\lambda_{10}$ | 0110110010101111010111110010011001101101111010100001010001101110 |
| $\lambda_{11}$ | 0110110011110101100111110100000010010110011111010011100100011 |
| $\lambda_{12}$ | 0011100010100101111111101100110010010101110011000110100111110000 |
| $\lambda_{13}$ | 0101111111101011100100101100011011000100110110111101010100000 |
| $\lambda_{14}$ | 0010011101111011101011011100100111101000011011010011100010101000 |
| $\lambda_{15}$ | 0100110101111110110110111110100000010101110011010100001010001 |
| $\lambda_{16}$ | 0011010111110100110101111010110000010011100101010101100011010 |
| $\lambda_{17}$ | 0100101101110111110110001011010100000010100001111110000111011101 |
| $\lambda_{18}$ | 0110010110011110110101000111110100010100100000100010100111111 |
| $\lambda_{19}$ | 0110100101001011110000111111100111100001100110101010100101 |
| $\lambda_{20}$ | 0111101100000100111101011110100001011111001000001101100011011 |
| $\lambda_{21}$ | 0111011011011111010001000111010001001011011010101100001110100 |
| $\lambda_{22}$ | 0011111100110100110100011110101011000011001110011101001 |
| $\lambda_{23}$ | 0001111011101111010010110111010110111011110000100010010110100 |
| $\lambda_{24}$ | 0001011111010000101110110111110010101010011110000001 |
| $\lambda_{25}$ | 0101011000111111110010010101010011100111110000110100110 |
| $\lambda_{26}$ | 0111011001010100011101101100010101000011110101010011101110 |
| $\lambda_{27}$ | 0011010011011110101110011110100101100000010011100001011011 |
| $\lambda_{28}$ | 00011011100010101111011110101100100111101100011000001110111 |
| $\lambda_{29}$ | 010100111001111110001011111011000001001001110101001111101010011 |

TABLE 2-continued

Coset leaders of the length-64 Kerdock code.

| Coset leader | Value |
|---|---|
| $\lambda_{30}$ | 0010011000110111101011111101011000101001101011000110111011000 |
| $\lambda_{31}$ | 0001110101110110100011110111100001001001110100101011100101110 |
| $\lambda_{32}$ | 0000001111100110011111110011110101011001011001011010100110101 |

In an embodiment, the columns of the SSC projection matrix F are Zadoff-Chu (ZC) sequences of a quasi-orthogonal set of ZC sequences of prime length M. The obtained matrix is then used for transmission according to a SSC scheme. The columns of the $c^{th}$ submatrix $F_c$ are circular shifts of the same ZC sequence, where a ZC sequence with root index u is defined as $$z_u(k) = e^{-j\frac{\pi}{M}uk(k+M \bmod 2)}, k = 0, \ldots, M-1 \quad (8)$$

ZC sequences have the convenient property that any circular shift of a given sequence $z_u=(z_u(k))_{k=1}^M$ is orthogonal to the original sequence:

$$\langle z_u, z_u^{(f)} \rangle = 0, f \neq 0 \quad (9)$$

where $z_u^{(f)}$ denotes the circular shift of sequence $z_u$ by f positions, defined as $z_u^{(f)}(k) = z_u(f+k)_M$. Here, M is the sequence length and $(a)_M = 1+(a-1) \bmod M$. Up to M−1 different sub-matrices can be obtained as M−1 distinct root indices $u \in \{1, \ldots, M-1\}$ are available.

The $c^{th}$ submatrix $F_c$ is thus obtained as $$[F_c]_{i,j} = z_c^{(j)}(i), c=1, \ldots, 2^{m-1}, i,j=1, \ldots, M \quad (10)$$

The cross-correlation of any two ZC sequences of same length M and different root indices is upper bounded by $\sqrt{M}$. Therefore, any ZC-based quasi-orthogonal (QO) SSC projection matrix fulfills (6) as $$\frac{f_p^H f_q}{|f_p||f_q|} \leq \frac{1}{\sqrt{M}}.$$

In an embodiment, the SSC projection matrix F is obtained by concatenation of multiple (Q) smaller SSC projection matrices obtained by phase-rotation of the same SSC projection matrix $F_0$ as follows:

$$F=[F_0 F_0 e^{j\varphi_1} \ldots F_0 e^{j\varphi_{Q-1}}]. \quad (11)$$

In other words, at least one submatrix $F_a$ of the projection matrix F is a phase-rotated version of another submatrix $F_b$ of the projection matrix F. As a result, the SSC projection matrix of equation (11) contains the same submatrices as $F_0$ and their multiple phase rotations.

SSC projection matrices containing multiple phase rotations of the same columns/submatrices as in F of equation (11) would introduce ambiguity on detection as the projection of the received signal onto any of those columns would have the same value $|\langle f_i, r \rangle| = |\langle f_i e^{j\varphi}, r \rangle|$, $\varphi \in [0, 2\pi]$ (apart from the contribution of noise/distortion/impairments). Therefore, decoding based on maximization of the column projections would not work. However, in coherent receivers the carrier phase is recovered and used for coherent detection. A similar situation arises in OFDM systems where demodulation reference signals are transmitted interleaved with data to allow receiver estimation of the channel magnitude and phase in each of the time-frequency resources used for transmission.

The projection operation performed by a coherent SSC receiver is the following:

$$\hat{p} = \langle \Re f_i, r \rangle, i=1, \ldots, N \quad (12)$$

Taking the real part in the projection and selecting as in (4) the columns that correspond to the maximum projections in equations (12) eliminates the aforementioned ambiguity and thus enables using extended projection matrices. Table 3 below summarizes few relevant SSC matrix extension types. The portmanteau quadriorthogonal refers to a combination of quadrature extension and biorthogonal extension.

TABLE 3

SSC projection matrix extension types.

| Extension type | Q | $(\varphi_1, \ldots, \varphi_{Q-1})$ |
|---|---|---|
| Quadrature | 2 | $(\pi/2)$ |
| Biorthogonal | 2 | $(\pi)$ |
| Quadriorthogonal | 4 | $(\pi/2, \pi, 3\pi/2)$ |

SSC projection matrix concatenation generates larger SSC matrices, thereby potentially supporting transmission of longer messages and ultimately achieving increased spectral efficiency. One drawback of SSC projection matrix concatenation is that the corresponding SSC scheme might not be uniquely decodable. For example, any biorthogonal concatenation ($\varphi_0 = \pi$) contains a set of columns and their opposites. Each column in the left half of the SSC matrix has a corresponding opposite column in the right half. If any information message m that selects any of the columns in the left half together with its opposite in the right half is transmitted, then the two columns cancel each other in the superposition and the resulting transmitted signal is all-zero. As such cancellation may happen for more than one message, then multiple messages would be transmitted with the same all-zero signal. The resulting SSC scheme would not be uniquely decodable. A similar drawback is also in quadriorthogonal concatenations, as any column, its opposite and its quadrature phase rotations are in the SSC matrix.

Figure 7:
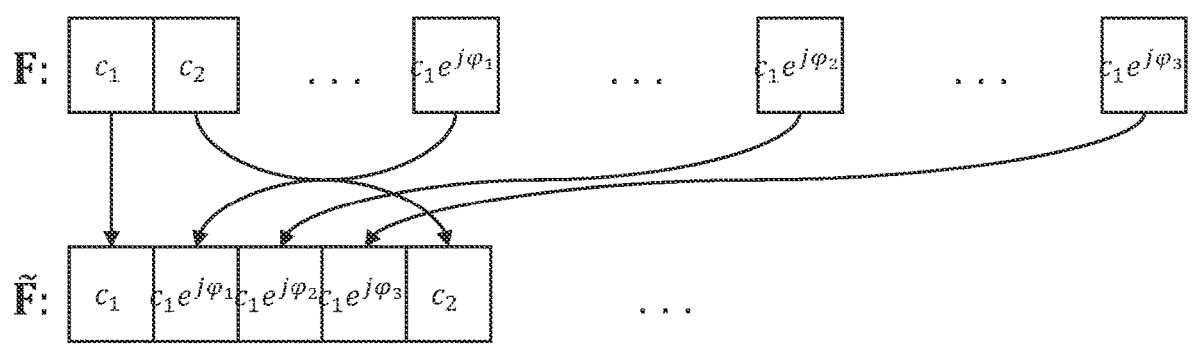
FIG. 7 illustrates a graphical representation of permutation of the columns of a SSC projection matrix containing multiple phase rotations of same submatrices.

In order to obtain unique decodability, the columns of the extended SSC projection matrix F in equation (11) are permuted in a way that any column cannot be selected in combination with its opposite or any of its quadrature phase rotations, thereby achieving unique decodability. Thanks to the sparseness of x, any permutation that groups together in nearby positions any given column, its opposite and quadrature phase rotations is enough to achieve unique decodability, with the condition that B is an integer multiple of Q. As an example, an extended SSC projection matrix F obtained by quadriorthogonal concatenation would be permuted as $$\tilde{F}=[F(1) F(1+N_0) F(2+N_0) \ldots F(1+(Q-1)N_0) F(2+N_0) \ldots] \quad (13)$$

where F(i) denotes the $i^{th}$ column of F and $N_0$ is the number of columns in $F_0$. A graphical representation of such kind of permutation, with Q=4, is shown in FIG. 7 where each square represents a matrix column, the upper part shows the arrangement of columns in the original matrix, i.e. F, and the lower part shows the arrangement of columns in the matrix after permutation, i.e. $\tilde{F}$.

In an embodiment, the subset of columns of the SSC projection matrix of the previous embodiments are selected according to a sparse vector generated by dividing the information message m into L segments of size b bits each. Each segment is mapped to one of L subvectors $x_1, \ldots, x_L$ of same length $B=2^b$, where the $l^{th}$ subvector has h=1 non-zero elements. The locations of the non-zero elements are obtained based on the bits in the $l^{th}$ message segment. For example, the location of the non-zero element could be the integer value of the corresponding message segment. Hence, in other words the transmitter device 100 is configured to select one column from each submatrix $[F_1 \; F_2 \; \ldots \; F_C]$.

In an embodiment, the subset of columns of the SSC projection matrix of previous embodiments are selected according to a sparse vector generated by dividing the information message m into L segments of size b bits each. Each segment is mapped to one of L subvectors $x_1, \ldots, x_L$ of same length B, where the $l^{th}$ subvector has h>1 non-zero elements and $b \leq \log_2$ $$\binom{B}{h}.$$

The non-zero elements in the $l^{th}$ subvector are $[x_l]_{i_{l,1}}, \ldots, [x_l]_{i_{l,h}}$, and the set of indices $(i_{l,1}, \ldots, i_{l,h})$ is selected among the $$\binom{B}{h}$$

combinations of h out of B elements. For example, when h=2 the locations of the non-zero elements in the $l^{th}$ segment could be obtained by mapping the integer value $v_l$ of the corresponding message segment $x_l$ to one of the $$\binom{B}{2}$$

combinations as $$a_1 = \left\lfloor \frac{v_l}{B-1} \right\rfloor; \; a_2 = \begin{cases} v_l \bmod(B-1), & \text{if } a_1 > v_l \bmod(B-1) \\ v_l \bmod(B-1)+1, & \text{otherwise} \end{cases}$$

and then taking $(i_{l,1}, i_{l,2})=(a_1+1, a_2+1)$ if $a_1<a_2$, and $(i_{l,1}, i_{l,2})=(B-a_1, B-a_2)$ otherwise. Hence, in other words the transmitter device 100 is configured to select two or more columns from each submatrix $[F_1 \; F_2 \; \ldots \; F_C]$.

In some case rate adaptation may be needed for transmission of the information message m so as to adapt to the number available time-frequency resources for transmission. Therefore, methods for puncturing and extension is hereby also presented. In the puncturing case so as to increase the rate the transmitter devices 100 punctures symbols of the transmission signal z when a number of time-frequency resources available for transmission is smaller than the M number of transmission symbols of the transmission signal z. On the other hand so as to decrease the rate the transmitter devices 100 repeats symbols of the transmission signal z when a number of time-frequency resources available for transmission is larger than M number of transmission symbols of the transmission signal z.

In an embodiment, the length-M signal is punctured as the number of time-frequency channel resources available for transmission is M'<M. Thus, M−M' symbols in the generated length-M signal are punctured or removed, i.e., they are not transmitted. The same punctured signal can be obtained by removing M−M' rows in the SSC projection matrix F thereby obtaining a new projection matrix $F_p$ with the remaining rows according to a predefined pattern p.

As a first example, a uniform puncturing pattern could be conveniently obtained as $$p = \left[1, \left\lfloor 1 + \frac{M}{M'} \right\rfloor, \left\lfloor 1 + 2\frac{M}{M'} \right\rfloor, \ldots, \left\lfloor 1 + (M'-1)\frac{M}{M'} \right\rfloor\right] \quad (14)$$

where p contains the indices of the selected rows of the projection matrix F used to generate $F_p$. According to equation (14), the punctured symbols are evenly spaced along the signal.

As a second example, M−M' consecutive symbols are punctured. Thus, the corresponding pattern is $p=[1, \ldots, p_0, p_0+M-M'+1, \ldots, M]$, where $p_0$ is any integer between 0 and M'.

In an embodiment, the length-M signal is extended as the number of time-frequency channel resources available for transmission is M''>M. Thus, M''−M symbols in the generated signal are repeated/duplicated, i.e., transmitted twice. The same extended signal can be obtained by duplication of M''−M rows in the SSC projection matrix F thereby obtaining a new projection matrix $F_d$ with repeated rows according to a predefined pattern.

As a first example, a uniform repetition pattern could be conveniently obtained as $$d = \left[1, \left\lfloor 1 + \frac{M}{M''} \right\rfloor, \left\lfloor 1 + 2\frac{M}{M''} \right\rfloor, \ldots, \left\lfloor 1 + (M''-1)\frac{M}{M''} \right\rfloor\right] \quad (15)$$

where d contains the indices of the selected rows of the projection matrix F used to generate $F_d$. Each row of the projection matrix F can be selected more than once. According to equation (15), the duplicated symbols are evenly spaced along the signal.

As a second example, M''−M consecutive symbols are repeated. Thus, the corresponding pattern is $d=[1, \ldots, M, d_0, \ldots, d_0+M''-M-1]$, where $d_0$ is any integer between 1 and 2M−M''+1.

The QO-SSC receiver device 300 recovers the information message from the received signal r=z+n, where n corresponds to, e.g., additive noise, transmitter distortion, interference or any other impairments. A simple projection receiver projects the received signal r onto each column of the matrix F as:

$$p = \Re(F^H r) \quad (16)$$

and then uses the columns corresponding to the highest correlation:

$$\hat{d} = \arg\max_{d=1,\ldots,N} p_d \qquad (17)$$

for recovery of the transmitted message. Simple projection yields rather limited performance when the number of superposed columns is larger than 2.

Figure 8:
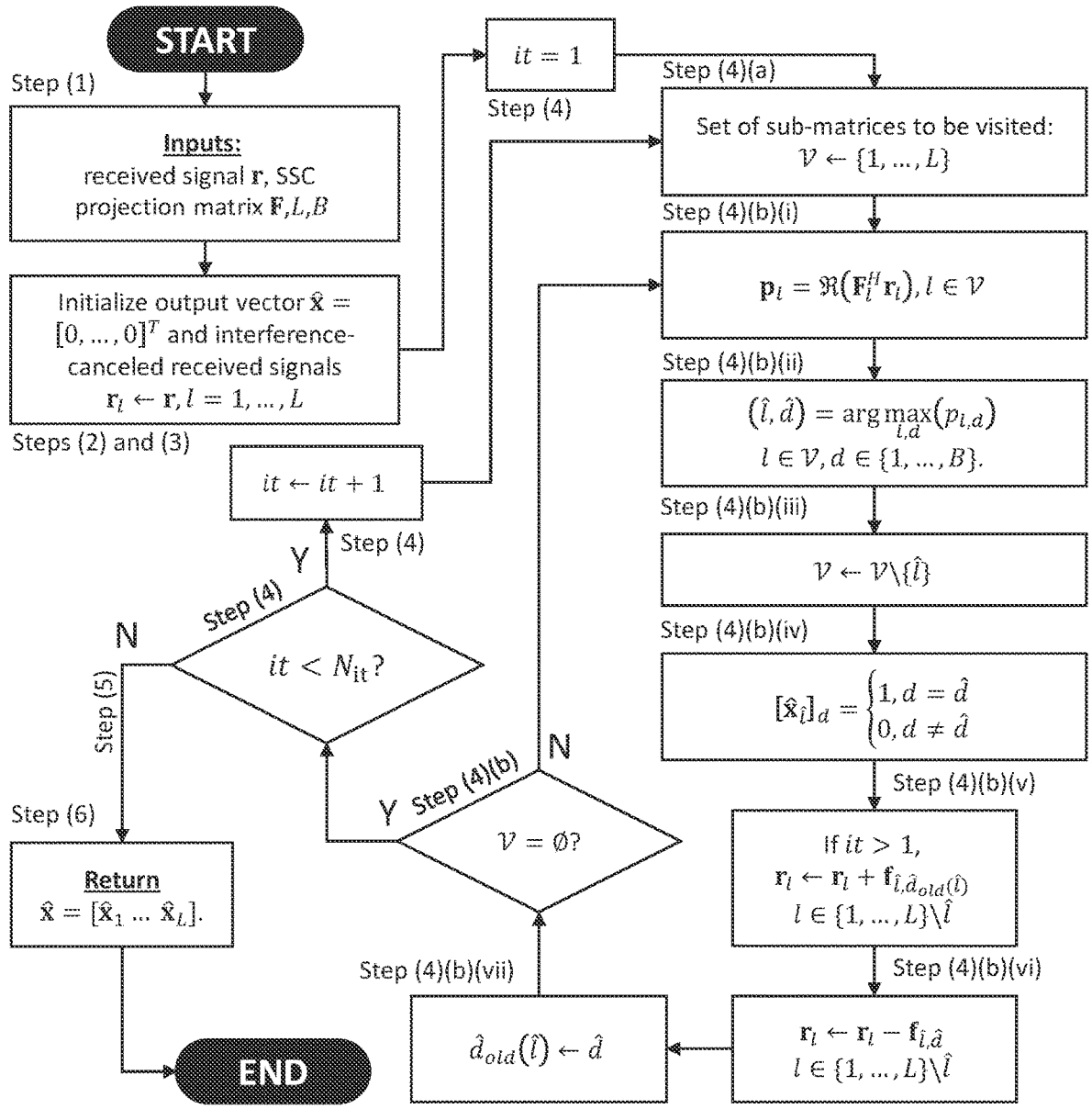
FIG. 8 shows a flow chart of decoding algorithm in a receiver device according to an embodiment.

Thus, enhanced a receiver device is needed. Enhanced performance is obtained performing Iterative Successive Interference Cancellation (ISIC). The ISIC receiver operates according to the following algorithm (here, assuming h=1—extension to h>1 is straightforward—and the SSC projection matrix F is divided into L sub-matrices of size M×B). FIG. 8 illustrates the following ISIC SSC decoding algorithm with reference to the step numerals give herein below.

Hence, with reference to the flow chart in FIG. 8 the decoding algorithm runs as follows:
(1) Inputs to the algorithm: the received signal r, SSC projection matrix F, parameters L and B, and number of iterations $N_{it}$ at step (1) in FIG. 8.
(2) Initialize output vector $\hat{x}=[0, \ldots, 0]^T$ at step (2) in FIG. 8.
(3) Initialize interference-canceled received signals $r_l \leftarrow r$, l=1, ..., L at step (3) in FIG. 8.
(4) For it=1 to $N_{it}$ at step (4) in FIG. 8:
  (a) Set of sub-matrices to be visited in current iteration: V={1, ..., L}.
  (b) While V is not empty
    (i) Project each $r_l$, l∈V, onto the corresponding sub-matrix $F_l$ and obtain projection vectors $p_l = \Re(F_l^H r_l)$.
    (ii) Select the largest projection value $p_{\hat{l},\hat{d}}$ among those in all projection vectors $p_l$:

$$(\hat{l}, \hat{d}) = \operatorname*{argmax}_{l,d}(p_{l,d}),$$

l∈V, d∈{1, ..., B}.
    (iii) V←V\{$\hat{l}$}.
    (iv) Set $[\hat{x}_{\hat{l}}]_d=1$ when $d=\hat{d}$ and $[\hat{x}_{\hat{l}}]_d=0$ otherwise.
    (v) If it>1, then sum the $\hat{d}_{old}^{th}(\hat{l})$ column of $F_{\hat{l}}$ ($f_{\hat{l},\hat{d}_{old}(\hat{l})}$) to the interference-canceled received signals: $r_l \leftarrow r_l + f_{\hat{l},\hat{d}_{old}(\hat{l})}$, l∈{1, ..., L}\{$\hat{l}$}.
    (vi) Cancel the $\hat{d}^{th}$ column of $F_{\hat{l}}$ ($f_{\hat{l},\hat{d}}$) from the interference-canceled received signals: $r_l \leftarrow r_l - f_{\hat{l},\hat{d}}$, l∈{1, ..., L}\{$\hat{l}$}.
    (vii) Set $\hat{d}_{old}(\hat{l}) \leftarrow \hat{d}$.
  (c) End While;
(5) End For at step (5) in FIG. 8;
(6) Return $\hat{x}=[\hat{x}_1^T \ldots \hat{x}_L^T]^T$ at step (6) in FIG. 8, wherein the non-zero elements of vector $\hat{z}$ indicates the subset of the columns of the projection matrix.

In its inner signal processing iterations, the ISIC receiver repeatedly executes a sequence of three basic steps:
Project an interference cancelled received signal onto the columns of a set of submatrices;
Select the largest projection value among those obtained in the previous step;
Cancel the column corresponding to the selected projection value from the interference cancelled received signal.
Computation of projections in step (4)(b)(i) in the algorithm illustrated in FIG. 8 is the most demanding operation in the ISIC algorithm in terms of computational load. For a submatrix $F_l$ having size M×M, projection computation $F_l^H r$ has complexity $M^2$, where M is the sequences length. When the SSC projection matrix is of QO-ZC type, the computational complexity of that step can be greatly reduced: as QO-ZC matrices contain circular shifts of the same sequences, computation of projection $F_l^H r$ can be conveniently performed by computing the circular cross-correlation between the received signal and the ZC sequence in the Fourier-transform domain as $F_l^H r = \text{IFFT}(\text{FFT}(z^*_u) \circ \text{FFT}(r))$, where (I)FFT denotes the (Inverse) Fast Fourier Transform. The complexity is reduced to 3 $\log_2$ M+M (assuming FFT computed using the radix-2 algorithm). A similar complexity reduction can be obtained for QO-K SSC by computing the correlations in the Hadamard transform domain. It has been observed in performance evaluations that, for L≤√M/2, the ISIC decoder performance approaches Maximum-Likelihood (ML) receiver performance.

Figure 9:
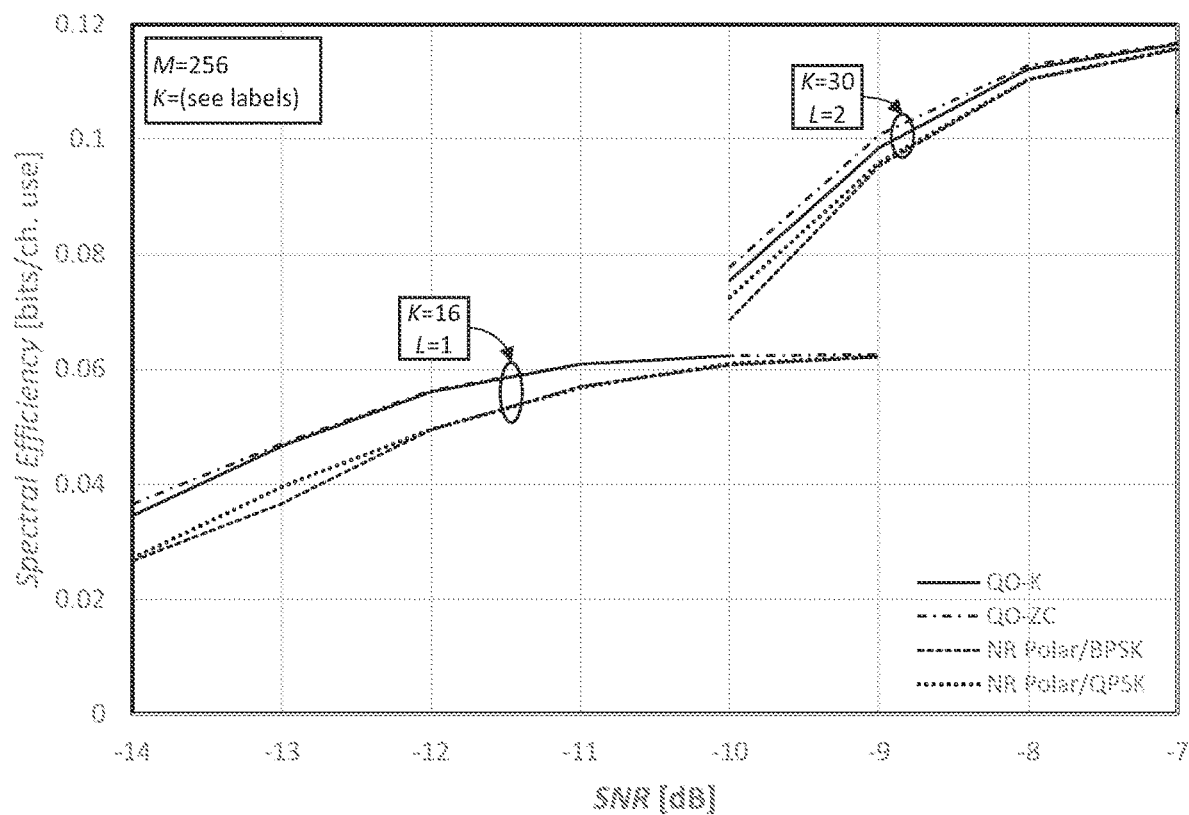
FIGS. 9-11 show performance results for embodiments.

The spectral efficiency (SE) performance of SSC with QO-K and QO-ZC has been evaluated. Results are shown in FIG. 9 where QO-K SSC and QO-ZC SSC schemes are compared with NR polar codes. Performance comparison with NR LDPC codes is not shown as it has been verified that NR polar codes perform better than NR LDPC codes for the considered SNR ranges, rates and spectral efficiencies. The number of selected columns per message subvector is h=1. The SSC matrix size is 256×$2^{16}$. The codeword length is M=256 symbols. The QO-ZC matrix is obtained by puncturing the last symbol of length-257 ZC sequences. The SSC matrix consists of 256 submatrices, where each submatrix contains 256 different circular shifts of a ZC sequence with given root index. Each submatrix corresponds to a different ZC root index. The QO-K SSC matrix has been obtained by quadrature concatenation from a 256×$2^{15}$ QO-K matrix. The channel model used for evaluation is AWGN. The SSC receiver performs ISIC decoding with 10 iterations. BLER is evaluated by Monte Carlo simulation. The spectral efficiency is computed as $$SE = (1 - BLER)\frac{K}{M}. \qquad (18)$$

Figure 10:
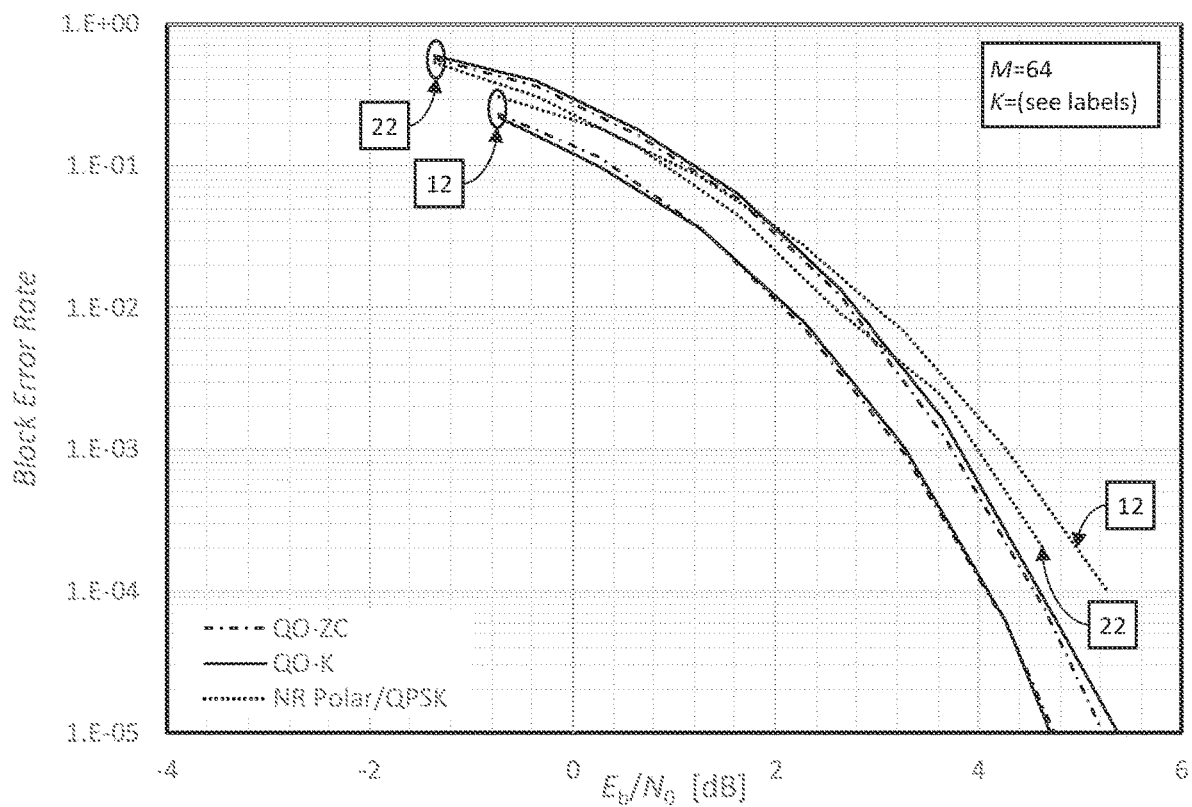

It is observed that QO-ZC and QO-K SSC have approximately the same performance. SSC has higher SE than NR polar codes for SNR<7 dB and SE<0.12 bits/s/Hz. FIG. 10 shows the BLER performance of QO-K and QO-ZC SSC compared with NR polar codes. The SSC matrix size is 64×$2^{12}$. The codeword length is M=64 symbols. The number of selected columns per message subvector is h=1. The QO-ZC matrix is obtained by puncturing three symbols of length-67 ZC sequences according to (14). The SSC matrix consists of 64 submatrices, where each submatrix contains 64 different circular shifts of a ZC sequence with given root index. Each submatrix corresponds to a different ZC root index. The QO-K SSC matrix has been obtained by quadrature concatenation from a 64×$2^{11}$ QO-K matrix. The channel model used for evaluation is AWGN. The SSC receiver performs ISIC decoding with 10 iterations. In FIG. 10 Block Error Rate of QO-K/QO-ZC SSC schemes. M: codeword length [symbols]. K: message length [bits].

Figure 11:
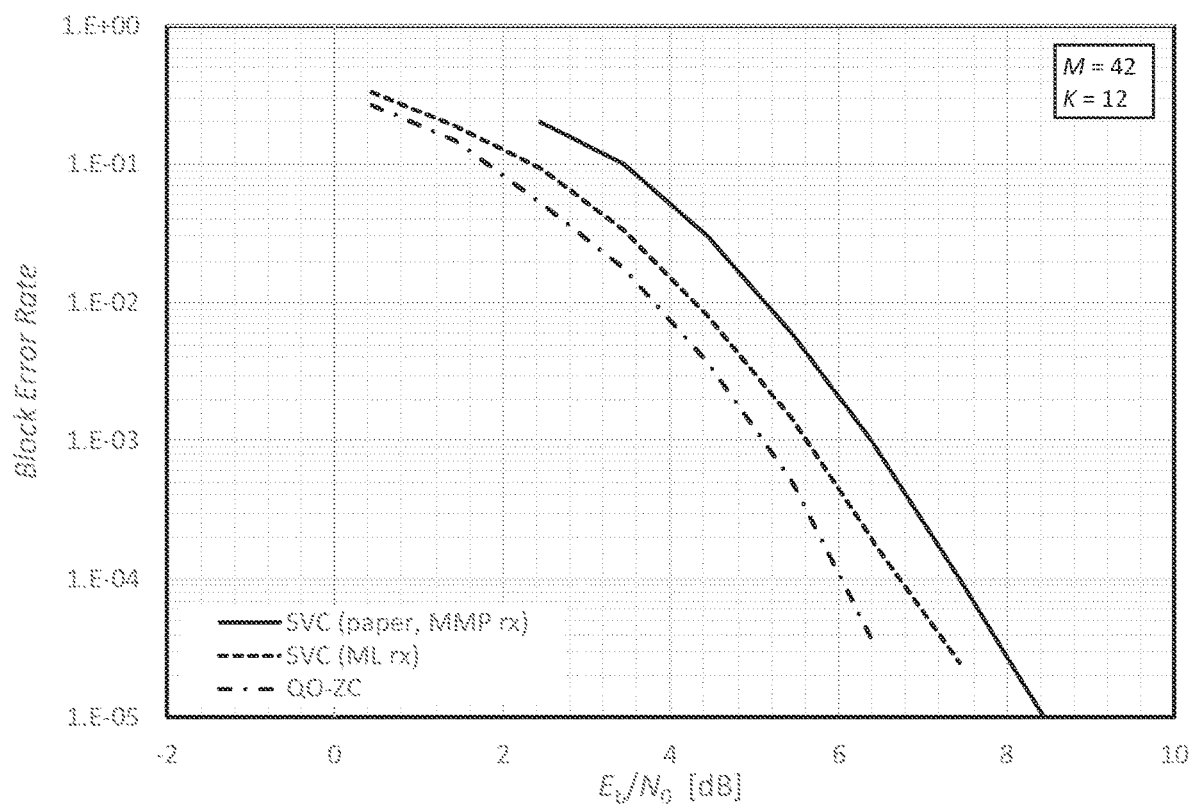

It is observed that QO-ZC and QO-K SSC have approximately the same performance. QO-K and QO-ZC SSC schemes have better BLER than NR polar codes as they achieve BLER=$10^{-5}$ at lower SNR than NR polar codes. FIG. 11 shows the BLER performance of QO-ZC SSC compared with prior-art SVC. A randomly generated matrix with elements in {-1, +1} was used. In FIG. 11, the performance of SVC is evaluated using a Maximum-Likelihood (ML) decoder and a Multipath Matching Pursuit (MMP) decoder. QO-ZC SSC performance is better than SVC in the whole range of SNRs.

The client device 900 herein, may be denoted as a user device, a User Equipment (UE), a mobile station, an internet of things (IoT) device, a sensor device, a wireless terminal and/or a mobile terminal, is enabled to communicate wirelessly in a wireless communication system, sometimes also referred to as a cellular radio system. The UEs may further be referred to as mobile telephones, cellular telephones, computer tablets or laptops with wireless capability. The UEs in this context may be, for example, portable, pocket-storable, hand-held, computer-comprised, or vehicle-mounted mobile devices, enabled to communicate voice and/or data, via the radio access network, with another entity, such as another receiver or a server. The UE can be a Station (STA), which is any device that contains an IEEE 802.11-conformant Media Access Control (MAC) and Physical Layer (PHY) interface to the Wireless Medium (WM). The UE may also be configured for communication in 3GPP related LTE and LTE-Advanced, in WiMAX and its evolution, and in fifth generation wireless technologies, such as New Radio.

The network access node 800 herein may also be denoted as a radio network access node, an access network access node, an access point, or a base station, e.g. a Radio Base Station (RBS), which in some networks may be referred to as transmitter, "gNB", "gNodeB", "eNB", "eNodeB", "NodeB" or "B node", depending on the technology and terminology used. The radio network access node may be of different classes such as e.g. macro eNodeB, home eNodeB or pico base station, based on transmission power and thereby also cell size. The radio network access node can be a Station (STA), which is any device that contains an IEEE 802.11-conformant Media Access Control (MAC) and Physical Layer (PHY) interface to the Wireless Medium (WM). The radio network access node may also be a base station corresponding to the fifth generation (5G) wireless systems.

Furthermore, any method according to embodiments of the disclosure may be implemented in a computer program, having code means, which when run by processing means causes the processing means to execute the steps of the method. The computer program is included in a computer readable medium of a computer program product. The computer readable medium may comprise essentially any memory, such as a ROM (Read-Only Memory), a PROM (Programmable Read-Only Memory), an EPROM (Erasable PROM), a Flash memory, an EEPROM (Electrically Erasable PROM), or a hard disk drive.

Moreover, it is realized by the skilled person that embodiments of the transmitter device 100 and the receiver device 300 comprises the communication capabilities in the form of e.g., functions, means, units, elements, etc., for performing the solution. Examples of other such means, units, elements and functions are: processors, memory, buffers, control logic, encoders, decoders, rate matchers, de-rate matchers, mapping units, multipliers, decision units, selecting units, switches, interleavers, de-interleavers, modulators, demodulators, inputs, outputs, antennas, amplifiers, receiver units, transmitter units, DSPs, MSDs, TCM encoder, TCM decoder, power supply units, power feeders, communication interfaces, communication protocols, etc. which are suitably arranged together for performing the solution.

Especially, the processor(s) of the transmitter device 100 and the receiver device 300 may comprise, e.g., one or more instances of a Central Processing Unit (CPU), a processing unit, a processing circuit, a processor, an Application Specific Integrated Circuit (ASIC), a microprocessor, or other processing logic that may interpret and execute instructions. The expression "processor" may thus represent a processing circuitry comprising a plurality of processing circuits, such as, e.g., any, some or all of the ones mentioned above. The processing circuitry may further perform data processing functions for inputting, outputting, and processing of data comprising data buffering and device control functions, such as call processing control, user interface control, or the like.

Finally, it should be understood that the invention is not limited to the embodiments described above, but relates to and incorporates all embodiments within the scope of the appended independent claims.

What is claimed is:

1. A transmitter device for a communication system, the transmitter device comprising:
processing circuitry configured to:
obtain an information message for transmission;
select a subset of columns of a projection matrix based on the information message (m), wherein the projection matrix is a concatenation of a plurality of submatrices, wherein each respective sub-matrix has a number M of rows, and wherein two columns in the same respective sub-matrix are orthogonal, and wherein two columns belonging to different respective sub-matrices have a correlation that is equal to or less than $1/\sqrt{M}$; and
superpose the selected subset of columns of the projection matrix so as to obtain a signal for transmission comprising the number M of transmission symbols.

2. The transmitter device according to claim 1, the processing circuitry being further configured to transmit the signal for transmission to a receiver device.

3. The transmitter device according to claim 1, the processing circuitry being further configured to select a sparse vector from a set of sparse vectors based on the information message; and multiply the selected sparse vector with the projection matrix.

4. The transmitter device according to claim 3, the processing circuitry being further configured to interleave the selected sparse vector before multiplying the selected sparse vector with the projection matrix.

5. The transmitter device according to claim 1, wherein each column of each respective submatrix is a Kerdock bent sequence of length M.

6. The transmitter device according to claim 1, wherein each column of each respective submatrix is a Zadoff-Chu sequence of length M.

7. The transmitter device according to claim 1, wherein at least a first submatrix of the projection matrix is a phase-rotated version of a second submatrix of the projection matrix.

8. The transmitter device according to claim 1, the processing circuitry being further configured to select one column from each respective submatrix.

9. The transmitter device according to claim 1, the processing circuitry being further configured to select two or more columns from each respective submatrix.

10. The transmitter device according to claim 1, the processing circuitry being further configured to puncture symbols of the signal for transmission when a number of time-frequency resources available for transmission is smaller than the number M of transmission symbols of the signal for transmission.

11. The transmitter device according to claim 1, the processing circuitry being further configured to repeat symbols of the signal for transmission when a number of time-frequency resources available for transmission is larger than M number of transmission symbols of the signal for transmission.

12. A receiver device for a communication system, the receiver device comprising:
processing circuitry configured to:
receive a signal from a transmitter device, the received signal including a number M of symbols associated with an information message;
obtain a projection matrix, wherein the projection matrix is a concatenation of a plurality of submatrices, wherein each respective sub-matrix has the number M of rows, and wherein two columns in the same respective sub-matrix are orthogonal, and wherein two columns belonging to different respective sub-matrices have a correlation that is equal to or less than $1/\sqrt{M}$;
perform iterative successive interference cancellation on the received signal based on the projection matrix so as to obtain a subset of the columns of the projection matrix; and
obtain a recovered information message based on the subset of the columns of the projection matrix.

13. The receiver device according to claim 12, the processing circuitry being further configured to determine a set of submatrices comprising all the submatrices in the projection matrix;
determine an interference cancelation signal to be equal to the received signal;
a) project the interference cancelation signal onto each column of the submatrices of the set of submatrices so as to obtain a set of projections,
b) select a column of the projection matrix with a largest projection in the set of projections,
c) add the selected column to a subset of the columns of the projection matrix,
d) cancel the selected column from the interference cancelation signal so as to obtain an updated interference cancelation signal,
e) remove the submatrix comprising the selected column from the set of submatrices;
repeat a) to e) until the set of submatrices is empty and output the subset of the columns of the projection matrix in c).

14. A method for a transmitter device, the method comprising:
obtaining an information message for transmission;
selecting a subset of columns of a projection matrix based on the information message, wherein the projection matrix is a concatenation of a plurality of submatrices, wherein each respective sub-matrix has a number M of rows, and wherein two columns in the same sub-matrix are orthogonal, and wherein two columns belonging to different sub-matrices have a correlation that is equal to or less than $1/\sqrt{M}$; and
superposing the selected subset of columns of the projection matrix so as to obtain a signal for transmission comprising the number M of transmission symbols.

15. A method for a receiver device, the method comprising:
receiving a signal from a transmitter device, wherein the received signal comprises a number M of symbols associated with an information message;
obtaining a projection matrix, wherein the projection matrix is a concatenation of a plurality of respective submatrices, wherein each respective sub-matrix has the number M of rows, and wherein two columns in the same sub-matrix are orthogonal, and wherein two columns belonging to different sub-matrices have a correlation that is equal to or less than $1/\sqrt{M}$;
performing iterative successive interference cancellation on the received signal based on the projection matrix so as to obtain a subset of the columns of the projection matrix; and
obtaining a recovered information message based on the subset of the columns of the projection matrix.

16. A non-transitory computer readable medium having stored thereon program code that, when executed by processing circuitry, causes the processing circuitry to carry out the method according to claim 14.

17. A non-transitory computer readable medium having stored thereon program code that, when executed by processing circuitry, causes the processing circuitry to carry out the method according to claim 15.

* * * * *